US012754238B2

(12) United States Patent
Haraguchi et al.

(10) Patent No.: US 12,754,238 B2
(45) Date of Patent: Oct. 6, 2026

(54) PROBE UNIT AND CHARGE/DISCHARGE INSPECTION DEVICE

(71) Applicant: NIPPON STEEL TEXENG. CO., LTD., Tokyo (JP)

(72) Inventors: Tomoki Haraguchi, Tokyo (JP); Teruhito Ishibashi, Tokyo (JP); Shigeru Saito, Tokyo (JP)

(73) Assignee: NIPPON STEEL TEXENG. CO., LTD., Tokyo (JP)

( * ) Notice: Subject to any disclaimer, the term of this patent is extended or adjusted under 35 U.S.C. 154(b) by 153 days.

(21) Appl. No.: 18/968,485

(22) Filed: Dec. 4, 2024

(65) Prior Publication Data

US 2025/0093420 A1 Mar. 20, 2025
US 2025/0258232 A9 Aug. 14, 2025

Related U.S. Application Data

(63) Continuation of application No. PCT/JP2023/027736, filed on Jul. 28, 2023.

(30) Foreign Application Priority Data

Jun. 9, 2022 (JP) ................................ 2022-093889

(51) Int. Cl.
*G01R 31/36* (2020.01)
*H01M 10/42* (2006.01)

(52) U.S. Cl.
CPC .... *G01R 31/3644* (2013.01); *H01M 10/4285* (2013.01)

(58) Field of Classification Search
CPC .......... G01R 1/06; G01R 31/36; G01R 1/073; G01R 31/3644
See application file for complete search history.

(56) References Cited

U.S. PATENT DOCUMENTS

2008/0185992 A1 8/2008 Hoffman et al.
2021/0215761 A1* 7/2021 Hsiao .................. H01M 10/443
2023/0384381 A1* 11/2023 Meißner .............. G01R 27/205

FOREIGN PATENT DOCUMENTS

CN 209911513 U 1/2020
CN 213689881 U 7/2021
(Continued)

OTHER PUBLICATIONS

International Search Report issued in PCT/JP2023/027736 mailed on Oct. 10, 2023 with English Translation (9 pages).
(Continued)

*Primary Examiner* — Tung X Nguyen
(74) *Attorney, Agent, or Firm* — Nakanishi IP Associates, LLC

(57) ABSTRACT

Provided is a probe unit for a charge/discharge inspection device that includes: a first probe holding plate on which one or more positive-electrode probes are arranged in order; and a second probe holding plate that is opposite to the first probe holding plate and on which one or more negative-electrode probes are arranged in order so as to correspond to the one or more positive-electrode probes, wherein the first probe holding plate or/and the second probe holding plate are attached so as to be movable in a direction toward each other and a direction away from each other. In particular, the probe unit includes a first moving mechanism that moves the first probe holding plate or/and the second probe holding plate in the direction toward each other and the direction away from each other.

2 Claims, 13 Drawing Sheets

(56) References Cited

FOREIGN PATENT DOCUMENTS

| | | | |
|---|---|---|---|
| CN | 214041678 | U | 8/2021 |
| CN | 113866466 | A | 12/2021 |
| JP | 2001-313086 | A | 11/2001 |
| JP | 2014-174049 | A | 9/2014 |
| JP | 2014-203778 | A | 10/2014 |
| JP | 2017-173012 | A | 9/2017 |
| JP | 2019-186105 | A | 10/2019 |
| JP | 2021-190159 | A | 12/2021 |
| WO | 2019/189170 | A1 | 10/2019 |

OTHER PUBLICATIONS

Written Opinion of International Searching Authority issued in PCT/JP2023/027736 mailed on Oct. 10, 2023 with English Translation (9 pages).

* cited by examiner

PROBE UNIT AND CHARGE/DISCHARGE INSPECTION DEVICE

CROSS-REFERENCE TO RELATED APPLICATIONS

This application is a Continuation Application of PCT application No. PCT/JP2023/027736 filed on Jul. 28, 2023, which is based upon and claims priority to Japanese Patent Application No. JP2022-093889 filed on Jun. 9, 2022, the disclosures of which are incorporated by reference.

TECHNICAL FIELD

The present invention relates to a probe unit for a charge/discharge inspection device that is attached to a secondary battery in charge/discharge inspection and in which the distance between a positive-electrode probe (contactor) and a negative-electrode probe (contactor) (hereinafter referred to as "inter-probe pitch") can be changed, and also relates to a charge/discharge inspection device using the same.

BACKGROUND ART

When charge/discharge inspection is performed, the probes (the positive electrode and the negative electrode) of a charge/discharge inspection device contact the electrodes (the positive electrode and the negative electrode) of a secondary battery to be inspected, so that power is supplied from the charge/discharge inspection device to the secondary battery. Further, the probes are generally provided in an arrangement corresponding to a secondary battery to be inspected, and when the type of the secondary battery to be inspected is changed, the whole probe unit is replaced.

Since the inspection of a plurality of types of secondary batteries is inevitably required in charge/discharge inspection, a technology that makes it possible to more efficiently inspect a plurality of types of secondary batteries is required.

For example, Patent Literature 1 describes a charge/discharge inspection system for inspecting a secondary battery and an attachment/detachment unit.

This charge/discharge inspection system is characterized by comprising: a charge/discharge inspection device for a secondary battery, the charge/discharge inspection device comprising a power source, a battery inspection unit having a connection part, and a contactor unit having a contactor for supplying power from the power source to the secondary battery; and a moving mechanism that moves the contactor unit to attach/detach it to/from the connection part, wherein the moving mechanism includes reaction force transmission means for transmitting reaction force generated when attaching/detaching the contactor unit to/from the connection part to a receiving part of the battery inspection unit.

Furthermore, it is characterized in that the moving mechanism includes: a conveying device for conveying a secondary battery to be inspected to the battery inspection unit; and an attachment/detachment unit that is attached to the conveying device and that moves the contactor unit in the battery inspection unit to attach/detach it to/from the connection part, and the reaction force transmission means is provided in the attachment/detachment unit.

On the other hand, this attachment/detachment unit is an attachment/detachment unit for attaching/detaching a contactor unit to/from a battery inspection unit of a charge/discharge inspection device, the attachment/detachment unit characterized by comprising: an attachment/detachment mechanism that moves the contactor unit to attach/detach it to/from the battery inspection unit; and reaction force transmission means for transmitting reaction force generated at the time of attachment/detachment to the battery inspection unit.

CITATION LIST

Patent Literature

Patent Literature 1: Japanese Patent Laid-Open No. 2014-174049

SUMMARY OF INVENTION

Technical Problem

However, since the charge/discharge inspection system and the attachment/detachment unit described in Patent Literature 1 are for attaching/detaching the contactor unit (the probe unit) to/from the battery inspection unit of the charge/discharge inspection device, it is necessary to replace the probe unit when the type of the secondary battery to be inspected is changed, and in addition, a mechanism for attaching/detaching the probe unit to/from the battery inspection unit is required. Further, since the probe unit is attached/detached using the conveying device, there is a risk that the production takt (the production schedule) in the charge/discharge inspection may be affected due to failure or deterioration of the conveying device.

Therefore, an object of the present invention is to provide a probe unit and a charge/discharge inspection device that make it possible to more efficiently inspect a plurality of types of secondary batteries.

Solution to Problem

A probe unit of the present invention is a probe unit for a charge/discharge inspection device including: a first probe holding plate on which one or more positive-electrode probes are arranged in order; and a second probe holding plate that is opposite to the first probe holding plate and on which one or more negative-electrode probes are arranged in order so as to correspond to the one or more positive-electrode probes, wherein the first probe holding plate or/and the second probe holding plate are attached so as to be movable in a direction toward each other and a direction away from each other.

Thereby, the first probe holding plate and the second probe holding plate move in the direction toward each other and the direction away from each other.

Further, the probe unit preferably includes a first moving mechanism that moves the first probe holding plate or/and the second probe holding plate in the direction toward each other and the direction away from each other.

Thereby, the first moving mechanism moves the first probe holding plate and the second probe holding plate closer to each other, or moves the first probe holding plate and the second probe holding plate away from each other.

In particular, it is preferable that the probe unit includes a movable support part that is provided between the first probe holding plate and the second probe holding plate so as to extend in a direction in which the positive-electrode probes or the negative-electrode probes are arranged, wherein in the first moving mechanism, the support part is linked to the first probe holding plate and the support part is linked to the second probe holding plate via a frame, and by moving the support part, a connection portion between the frame and the first probe holding plate or/and a connection portion between the frame and the second probe holding plate are moved in a direction connecting the first probe holding plate and the second probe holding plate.

Thereby, by moving the support part, the first probe holding plate and the second probe holding plate linked via the frame move closer to each other, or the first probe holding plate and the second probe holding plate move away from each other.

Further, it is preferable that the first probe holding plate includes a plurality of probe holding plates each on which one positive-electrode probe is disposed, the second probe holding plate includes a plurality of probe holding plates each on which one negative-electrode probe is disposed, and the probe unit includes a second moving mechanism that moves the plurality of first probe holding plates in a direction toward each other and a direction away from each other and moves the plurality of second probe holding plates in a direction toward each other and a direction away from each other.

Thereby, the plurality of first probe holding plates also move in the direction toward each other and the direction away from each other and the plurality of second probe holding plates also move in the direction toward each other and the direction away from each other.

In particular, it is preferable that in the second moving mechanism, a frame that links each of the plurality of first probe holding plates and each of the plurality of second probe holding plates corresponding to the first probe holding plate moves in a direction in which the support part extends to move the plurality of first probe holding plates and the plurality of second probe holding plates in a direction in which the plurality of positive-electrode probes or the plurality of negative-electrode probes are arranged.

Thereby, the first moving mechanism and the second moving mechanism can be realized at the same time using the support part.

On the other hand, a charge/discharge inspection device of the present invention comprises: a probe unit for the charge/discharge inspection device including a first probe holding plate on which one or more positive-electrode probes are arranged in order, a second probe holding plate that is opposite to the first probe holding plate and on which one or more negative-electrode probes are arranged in order so as to correspond to the one or more positive-electrode probes, and a guide part that is provided to each of the first probe holding plate and the second probe holding plate, wherein the first probe holding plate or/and the second probe holding plate are attached so as to be movable in a direction toward each other and a direction away from each other; and a separator part that is provided to a secondary battery and engages with the guide part and that is provided so as to fit a length in a lateral width direction of the secondary battery.

Thereby, the first probe holding plate and the second probe holding plate move in the direction toward each other and the direction away from each other, and when the probe unit is attached to the secondary battery, the guide part provided on the probe unit side engages with the separator part provided on the secondary battery side so as to fit the length in the lateral width direction of the secondary battery.

Note that it is preferable that the first probe holding plate includes a plurality of probe holding plates each on which one positive-electrode probe is disposed, the second probe holding plate includes a plurality of probe holding plates each on which one negative-electrode probe is disposed, the probe unit includes: a first moving mechanism that moves the first probe holding plate or/and the second probe holding plate in the direction toward each other and the direction away from each other; and a second moving mechanism that moves the plurality of first probe holding plates in the direction toward each other and the direction away from each other and moves the plurality of second probe holding plates in the direction toward each other and the direction away from each other, and the separator part is provided so as to also fit a length in a thickness direction of the secondary battery.

Thereby, the first moving mechanism moves the first probe holding plate and the second probe holding plate closer to each other, or moves the first probe holding plate and the second probe holding plate away from each other. Further, the second moving mechanism also moves the plurality of first probe holding plates in the direction toward each other and the direction away from each other and moves the plurality of second probe holding plates in the direction toward each other and the direction away from each other, and when the probe unit is attached to a secondary battery, the guide part provided on the probe unit side engages with the separator part provided on the secondary battery side so as to also fit the length in the thickness direction of the secondary battery.

Advantageous Effects of Invention (1) With the configuration in which a probe unit of the present invention is a probe unit for a charge/discharge inspection device including: a first probe holding plate on which one or more positive-electrode probes are arranged in order; and a second probe holding plate that is opposite to the first probe holding plate and on which one or more negative-electrode probes are arranged in order so as to correspond to the one or more positive-electrode probes, wherein the first probe holding plate or/and the second probe holding plate are attached so as to be movable in a direction toward each other and a direction away from each other, the first probe holding plate and the second probe holding plate move in the direction toward each other and the direction away from each other, and therefore the distance between the positive-electrode probes and the negative-electrode probes, that is, the inter-probe pitch can be easily adjusted. As a result, even when a plurality of types of secondary batteries with different lengths in the lateral width direction are inspected, it is not necessary to attach/detach the contactor probe unit to/from the battery inspection unit or to replace the probe unit itself, and therefore more efficient charge/discharge inspection can be realized.

(2) Further, since the probe unit includes the first moving mechanism as described above, the first moving mechanism moves the first probe holding plate and the second probe holding plate closer to each other or moves the first probe holding plate and the second probe holding plate away from each other, and by moving the support part, the first probe holding plate and the second probe holding plate linked via the frame move closer to each other or the first probe holding plate and the second probe holding plate move away from each other, so that more accurate adjustment of the inter-probe pitch can be realized.

(3) Further, with the configuration in which the first probe holding plate includes a plurality of probe holding plates each on which one positive-electrode probe is disposed, the second probe holding plate includes a plurality of probe holding plates each on which one negative-electrode probe is disposed, and the probe unit includes a second moving mechanism that moves the plurality of first probe holding plates in the direction toward each other and the direction away from each other and moves the plurality of second probe holding plates in the direction toward each other and the direction away from each other, the plurality of first probe holding plates also move in the direction toward each other and the direction away from each other and the plurality of second probe holding plates also move in the direction toward each other and the direction away from each other, so that the distance between the positive-electrode probes of the probe unit and the distance between the negative-electrode probes can be easily adjusted. As a result, even when a plurality of types of secondary batteries different in thickness are inspected, it is not necessary to attach/detach the contactor probe unit to/from the battery inspection unit or to replace the probe unit itself, and therefore more efficient charge/discharge inspection can be realized. Further, even when a secondary battery has swollen (the thickness has changed) in the charge/discharge inspection device, it is possible to prevent the secondary batteries or the probe unit from being compressed.

(4) Further, with the configuration in which in the second moving mechanism, a frame that links each of the plurality of first probe holding plates and each of the plurality of second probe holding plates corresponding to the first probe holding plate moves in a direction in which the support part extends to move the plurality of first probe holding plates and the plurality of second probe holding plates in a direction in which the plurality of positive-electrode probes or the plurality of negative-electrode probes are arranged, the first moving mechanism and the second moving mechanism can be realized at the same time using the support part, and therefore it is possible to prevent the configuration from becoming complex to realize cost reduction and ease of maintenance.

(5) On the other hand, with the configuration in which a charge/discharge inspection device of the present invention comprises: a probe unit for the charge/discharge inspection device including a first probe holding plate on which one or more positive-electrode probes are arranged in order, a second probe holding plate that is opposite to the first probe holding plate and on which one or more negative-electrode probes are arranged in order so as to correspond to the one or more positive-electrode probes, and a guide part that is provided to each of the first probe holding plate and the second probe holding plate, wherein the first probe holding plate or/and the second probe holding plate are attached so as to be movable in a direction toward each other and a direction away from each other; and a separator part that is provided to a secondary battery and engages with the guide part and that is provided so as to fit a length in a lateral width direction of the secondary battery, the first probe holding plate and the second probe holding plate move in the direction toward each other and the direction away from each other, and when the probe unit is attached to the secondary battery, the guide part provided on the probe unit side engages with the separator part provided on the secondary battery side so as to fit the length in the lateral width direction of the secondary battery, so that the adjustment of the inter-probe pitch in advance and the power for adjusting the inter-probe pitch are not needed, and therefore more efficient charge/discharge inspection can be implemented.

(6) Note that with the configuration in which the first probe holding plate includes a plurality of probe holding plates each on which one positive-electrode probe is disposed, the second probe holding plate includes a plurality of probe holding plates each on which one negative-electrode probe is disposed, the probe unit includes: a first moving mechanism that moves the first probe holding plate or/and the second probe holding plate in the direction toward each other and the direction away from each other; and a second moving mechanism that moves the plurality of first probe holding plates in the direction toward each other and the direction away from each other and moves the plurality of second probe holding plates in the direction toward each other and the direction away from each other, and the separator part is provided so as to also fit a length in a thickness direction of the secondary battery, the first moving mechanism moves the first probe holding plate and the second probe holding plate closer to each other, or moves the first probe holding plate and the second probe holding plate away from each other. Further, the second moving mechanism also moves the plurality of first probe holding plates in the direction toward each other and the direction away from each other and moves the plurality of second probe holding plates in the direction toward each other and the direction away from each other, and when the probe unit is attached to a secondary battery, the guide part provided on the probe unit side engages with the separator part provided on the secondary battery side so as to also fit the length in the thickness direction of the secondary battery, and therefore in charge/discharge inspection, the inter-probe pitch and the distance between probes can be adjusted by the first moving mechanism and the second moving mechanism, or the inter-probe pitch and the distance between probes can be adjusted by the guide part and the separator part, so that it is possible to select and realize the most efficient charge/discharge inspection method according to various inspection contents.

DESCRIPTION OF EMBODIMENTS

Embodiments of the present invention will be described below in detail, but the description of the constituent features described below shows examples (representative examples) of embodiments of the present invention, and the present invention is not limited to the following content unless the spirit thereof is changed.

Probe Unit

Figure 1:
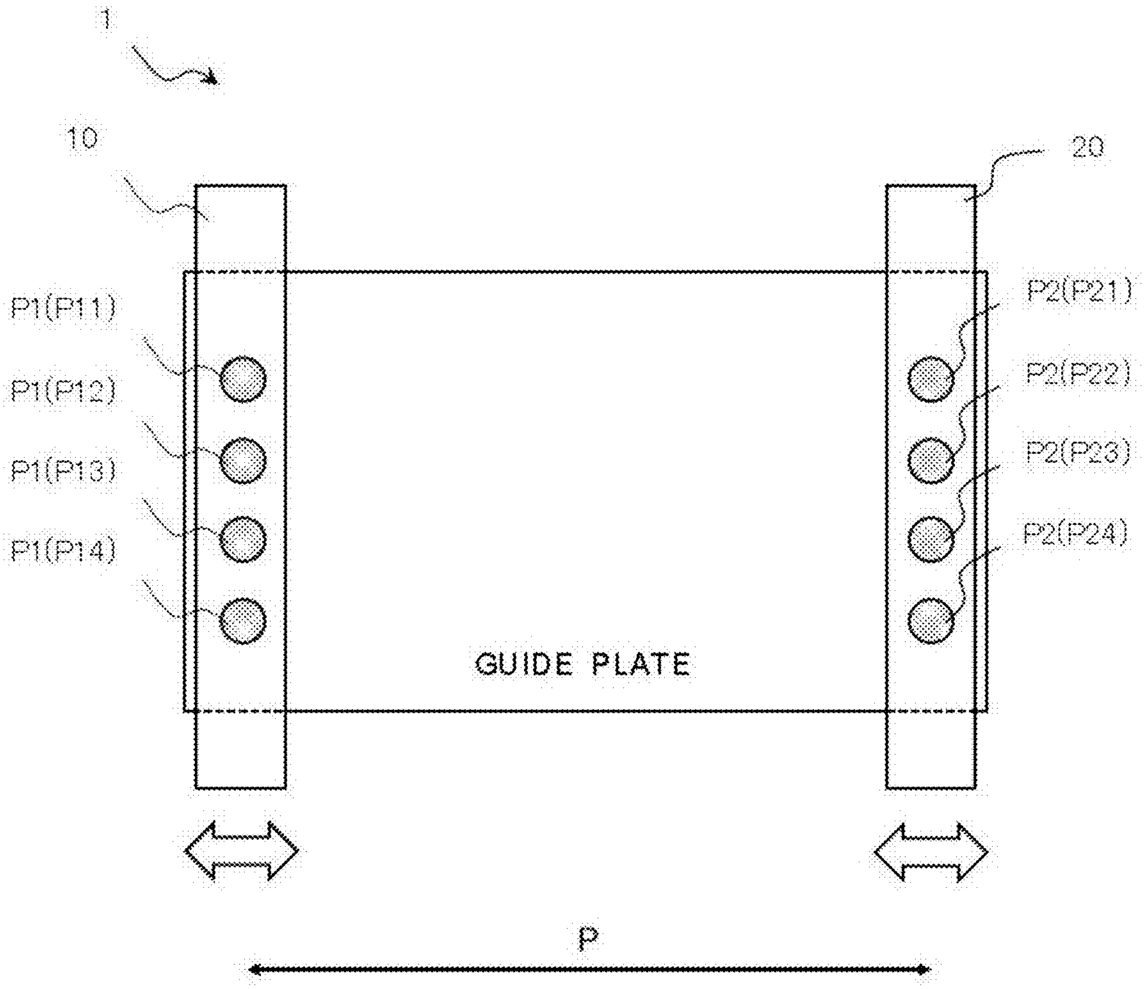
FIG. 1 is a schematic plan view of a probe unit according to an embodiment of the present invention.

FIG. 1 is a schematic plan view of a probe unit according to an embodiment of the present invention.

A probe unit 1 includes a first probe holding plate 10 and a second probe holding plate 20 disposed opposite to the first probe holding plate 10. The first probe holding plate 10 or/and the second probe holding plate 20 are attached to the probe unit 1 so as to be movable in the direction toward each other and the direction away from each other.

One or more positive-electrode probes P1 are arranged in order on the first probe holding plate 10. In this embodiment shown in FIG. 1, four positive-electrode probes P11, P12, P13, and P14 are arranged in order. Further, one or more negative-electrode probes P2 are arranged in order on the second probe holding plate 20. In this embodiment shown in FIG. 1, four negative-electrode probes P21, P22, P23, and P24 are arranged in order.

For these probes, not only a pin shape but also a clip shape or other shapes suitable for the secondary battery electrodes of the inspection device can be used as appropriate.

The probe unit 1 is attached to a secondary battery to be inspected in charge/discharge inspection. For example, a secondary battery is attached to the probe unit 1 from the back in FIG. 1. Specifically, the positive-electrode probe P11 contacts the electrode (the positive electrode) of a secondary battery, and the negative-electrode probe P21 contacts the other electrode (the negative electrode) of the secondary battery. In addition, power is supplied to the secondary battery via the probe unit 1 from a charge/discharge power source (not shown) connected by a cable C (see FIG. 4).

Note that in this embodiment, since four positive-electrode probes P1 and four negative-electrode probes P2 are arranged on the first probe holding plate 10 and the second probe holding plate 20, respectively, four secondary batteries can be attached to the probe unit 1 at one time.

Further, as described above, the first probe holding plate 10 or/and the second probe holding plate 20 are attached so as to be movable in the direction toward each other and the direction away from each other. For example, as shown in FIG. 1, the first probe holding plate 10 and the second probe holding plate 20 are provided on a guide plate, and the first probe holding plate 10 and the second probe holding plate 20 are attached so as to be slidingly movable on the guide plate.

This enables the first probe holding plate 10 to slide on the guide plate to move in the direction toward the second probe holding plate 20 (the upward direction in FIG. 1) or move in the direction away from the second probe holding plate 20 (the downward direction in FIG. 1). Note that the same applies to the second probe holding plate 20.

As a result, since one or more positive-electrode probes P1 are arranged in order on the first probe holding plate 10 and one or more negative-electrode probes P2 are arranged in order on the second probe holding plate 20, when the first probe holding plate 10 or/and the second probe holding plate 20 move in the direction toward each other, the positive-electrode probes P1 and the negative-electrode probes P2 also move closer to each other.

On the other hand, when the first probe holding plate 10 or/and the second probe holding plate 20 move in the direction away from each other, the positive-electrode probes P1 and the negative-electrode probes P2 also move away from each other.

When the type of the secondary battery is changed, the length between the positive electrode and the negative electrode of the secondary battery, in other words, the length of the lateral width of the secondary battery (hereinafter referred to as "the length in the lateral width direction") also changes. On the other hand, since the probe unit 1 can move the positive-electrode probes P1 and the negative-electrode probes P2 closer to or away from each other via the structure described above, it can easily adjust the distance between the positive-electrode probes P1 and the negative-electrode probes P2, that is, the inter-probe pitch P to fit the length in the lateral width direction of a secondary battery to be inspected.

First Moving Mechanism

Figure 2:
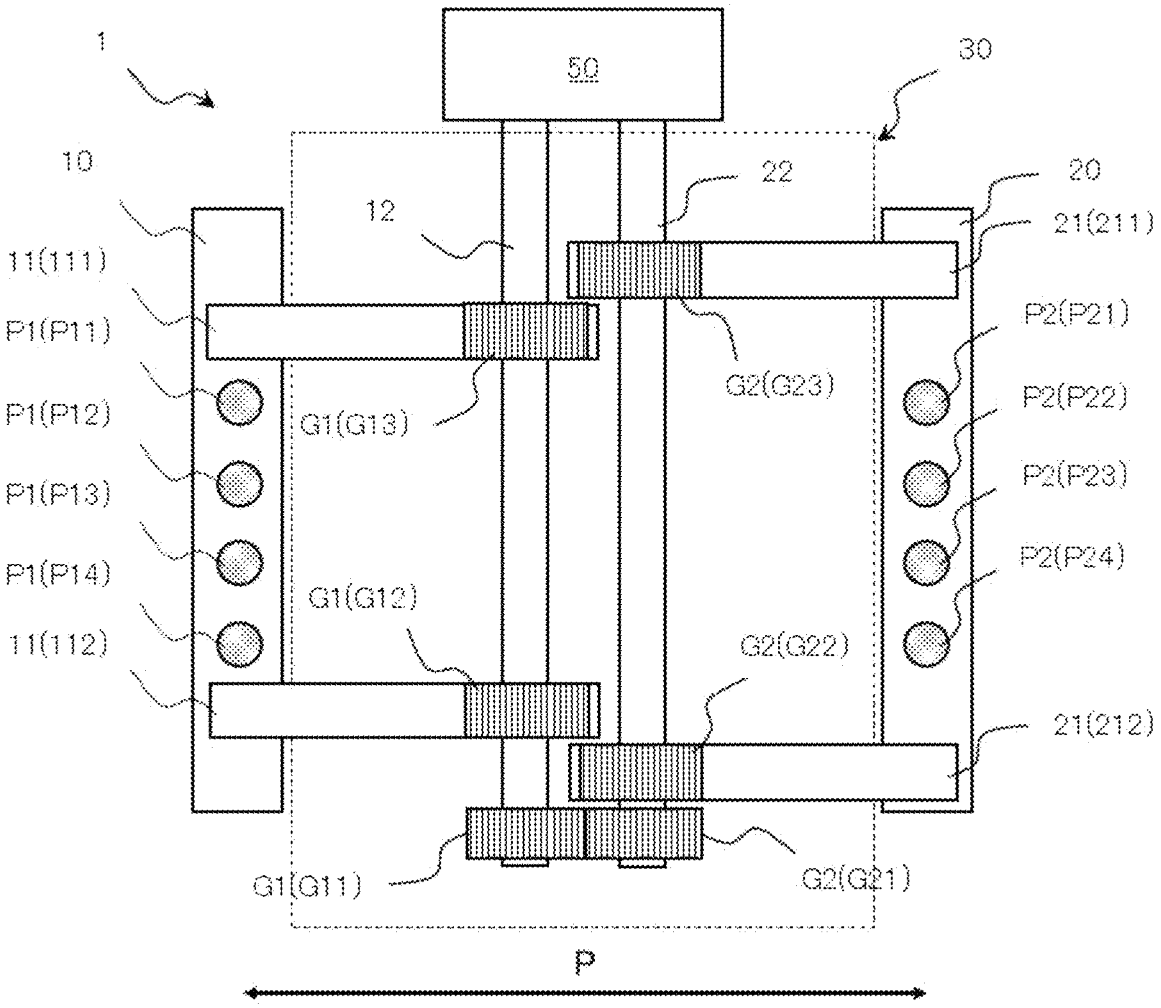
FIG. 2 is a schematic plan view of a probe unit according to an embodiment of the present invention.

FIG. 2 is a schematic plan view of a probe unit according to an embodiment of the present invention, and in the embodiment shown in FIG. 2, the probe unit 1 has a first moving mechanism 30 instead of the guide plate.

The first moving mechanism 30 is a mechanism that moves the first probe holding plate 10 and the second probe holding plate 20 in the direction toward each other and the direction away from each other. Since one or more positive-electrode probes P1 are arranged in order on the first probe holding plate 10 and one or more negative-electrode probes P2 are arranged in order on the second probe holding plate 20, when the first probe holding plate 10 and the second probe holding plate 20 are moved in the direction toward each other by the first moving mechanism 30, the positive-electrode probes P1 and the negative-electrode probes P2 also move closer to each other.

On the other hand, when the first probe holding plate 10 and the second probe holding plate 20 are moved in the direction away from each other by the first moving mechanism 30, the positive-electrode probes P1 and the negative-electrode probes P2 also move away from each other.

Thus, since the probe unit 1 can move the positive-electrode probes P1 and the negative-electrode probes P2 closer to or away from each other via the first moving mechanism 30, it is possible to easily adjust the distance between the positive-electrode probes P1 and the negative-electrode probes P2, that is, the inter-probe pitch P to fit the length in the lateral width direction of a secondary battery to be inspected.

Figure 3:
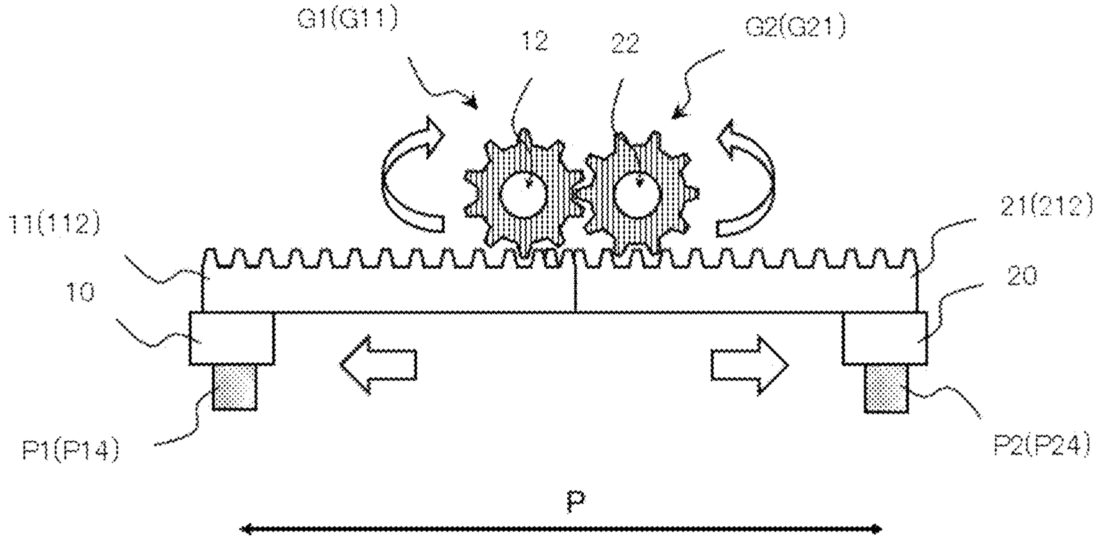
FIG. 3 is a schematic front view of the probe unit shown in FIG. 2.
Figure 4:
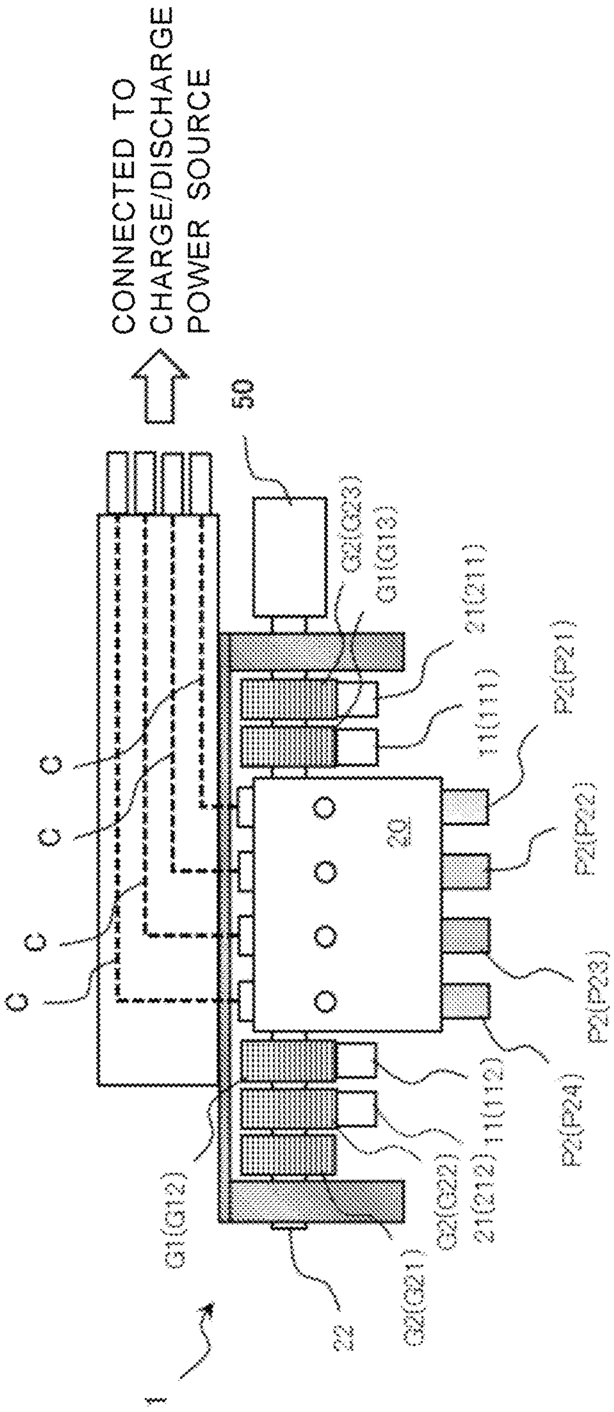
FIG. 4 is a schematic right-side view of the probe unit shown in FIG. 2.

Further, FIG. 3 is a schematic front view of the probe unit shown in FIG. 2, and FIG. 4 is a schematic right-side view of the probe unit shown in FIG. 2.

As shown in FIGS. 2-4, the first moving mechanism 30 includes support parts 12 and 22, frames 11 and 21, and rotating parts G1 and G2.

The support parts 12 and 22 are provided between the first probe holding plate 10 and the second probe holding plate 20 so as to extend in the direction in which the one or more positive-electrode probes P1 or the one or more negative-electrode probes P2 are arranged (the left-right direction in FIG. 2) (so as to extend in the direction perpendicular to the frames 11 and 12). Further, the support parts 12 and 22 are movable, and in this embodiment, the support parts 12 and 22 are, so to speak, rotation axes that can be rotated around the axial direction (the extending direction).

One end of each of the support parts 12 and 22 is movably (rotatably) held by a holding member (not shown) provided in the probe unit 1. On the other hand, the other end of each of the support parts 12 and 22 is attached to a power device 50 (see FIGS. 2 and 4). Further, the support parts 12 and 22 are provided with rotating parts G1 and G2 (see FIG. 3).

Further, the frame 11 is for linking the support part 12 and the first probe holding plate 10. The frame 11 and the first probe holding plate 10 are joined by welding, with screws, etc. On the other hand, the frame 11 and the support part 12 are linked via the rotating part G1 such as a gear (see FIG. 3). Note that in this embodiment, two frames 11 (frames 111 and 112) are provided. Therefore, the frames 111 and 112 are linked to the support part 12 via rotating parts G12 and G13, respectively.

On the other hand, the frame 21 is for linking the support part 22 and the second probe holding plate 20. The frame 21 and the second probe holding plate 20 are joined by welding, with screws, etc. On the other hand, the frame 21 and the support part 22 are linked via the rotating part G2 such as a gear (see FIG. 3). Note that in this embodiment, two frames 21 (frames 211 and 212) are provided as well. Therefore, the frames 211 and 212 are also linked to the support part 22 via rotating parts G22 and G23, respectively.

Further, the support parts 12 and 22 are arranged in parallel with each other, and are linked via the rotating parts G11 and G21 (see FIG. 3).

Here, as shown in FIG. 3, the frames 11 and 21 are, for example, rack gears having projections and depressions. Therefore, for example, when the support part 12, which is a rotation axis, rotates in the direction of the curved arrow shown in FIG. 3, the rotating part G11 also rotates in the direction. On the other hand, the rotating part G21 engaging with the rotating part G11 also rotates in the direction of the curved arrow shown in FIG. 3. As a result, the frames 11 (112) and 21 (212) engaging with the rotating parts G11 and G21 move in the directions of the arrows shown in FIG. 3. Therefore, the first probe holding plate 10 and the second probe holding plate 20 connected to the frames 11 (112) and 21 (212) also move in the directions of the arrows, that is, the direction away from each other. Of course, the support part 22 may be rotated instead of the support part 12.

Figure 5:
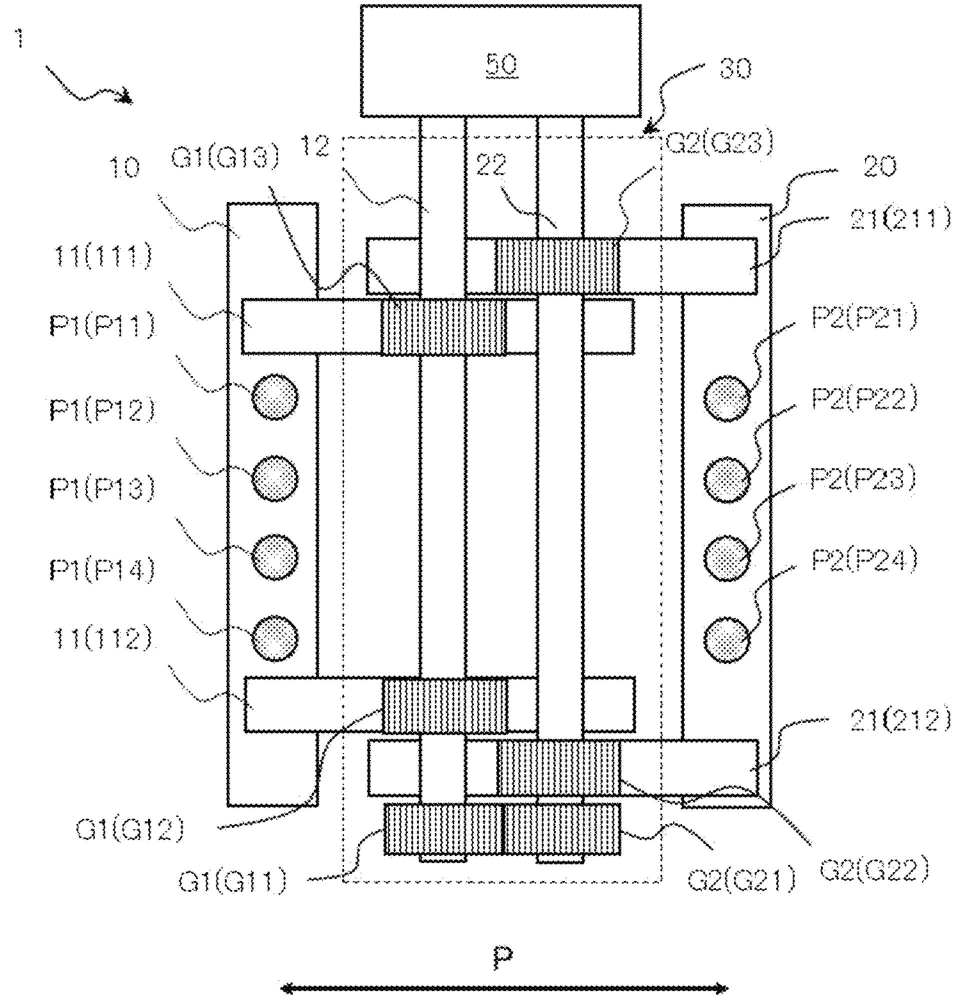
FIG. 5 is a schematic plan view of the probe unit when the inter-probe pitch is shortened.
Figure 6:
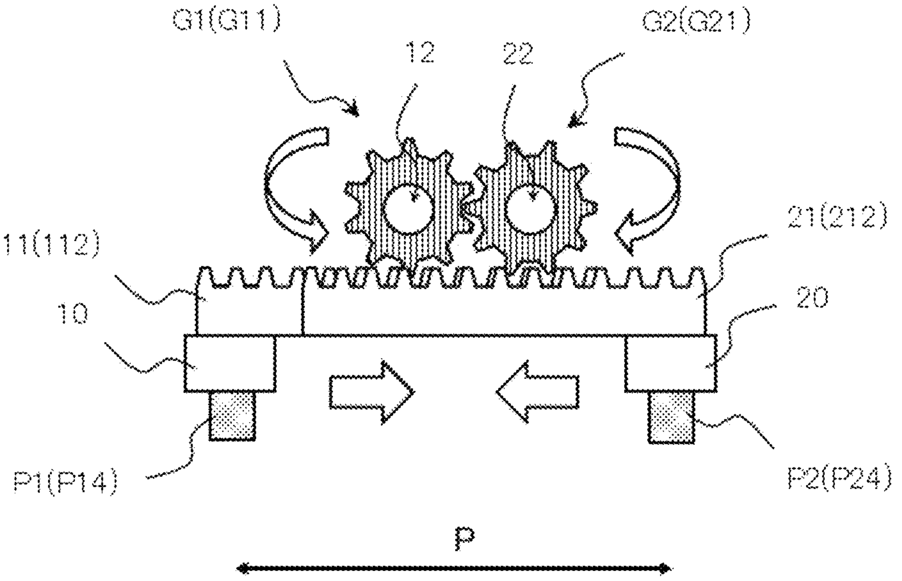
FIG. 6 is a schematic front view of the probe unit when the inter-probe pitch is shortened.

FIG. 5 is a schematic plan view of the probe unit when the inter-probe pitch is shortened, and FIG. 6 is a schematic front view of the probe unit when the inter-probe pitch is shortened.

Here, the parts having the same configurations or functions as the parts described using FIGS. 2-4 are given the same reference numerals and the detailed description thereof is omitted. Note that the same applies to the following description.

As shown in FIG. 6, when the support part 12, which is a rotation axis, rotates in the direction opposite to the direction described using FIG. 3, the first probe holding plate 10 and the second probe holding plate 20 move in the direction toward each other. As a result, as shown in FIG. 5, the inter-probe pitch P becomes shorter.

Thus, the probe unit 1 can easily adjust the length of the inter-probe pitch P by lengthening or shortening it via the first moving mechanism 30.

Modification of First Moving Mechanism

Figure 7:
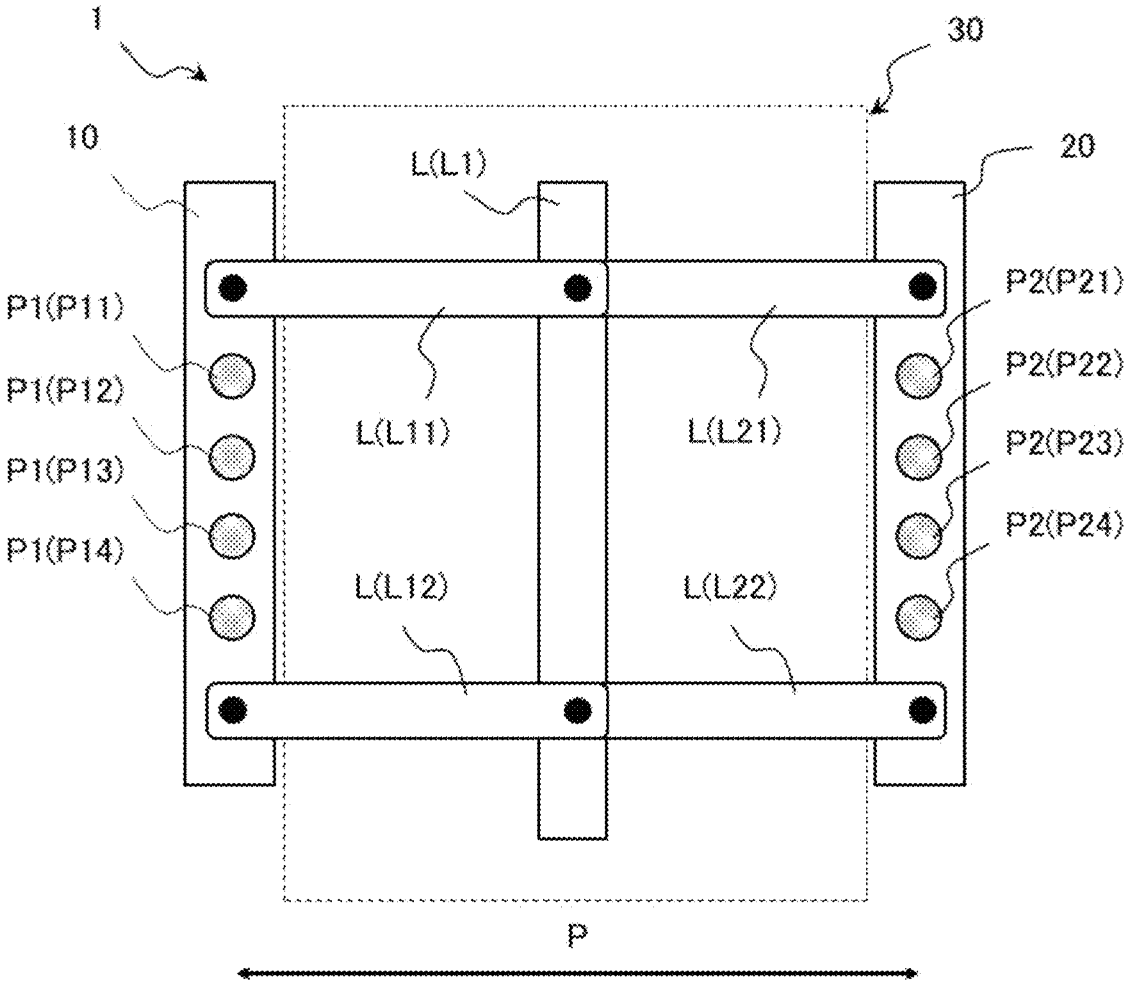
FIG. 7 is a schematic plan view of a probe unit showing a modification of a first moving mechanism.
Figure 8:
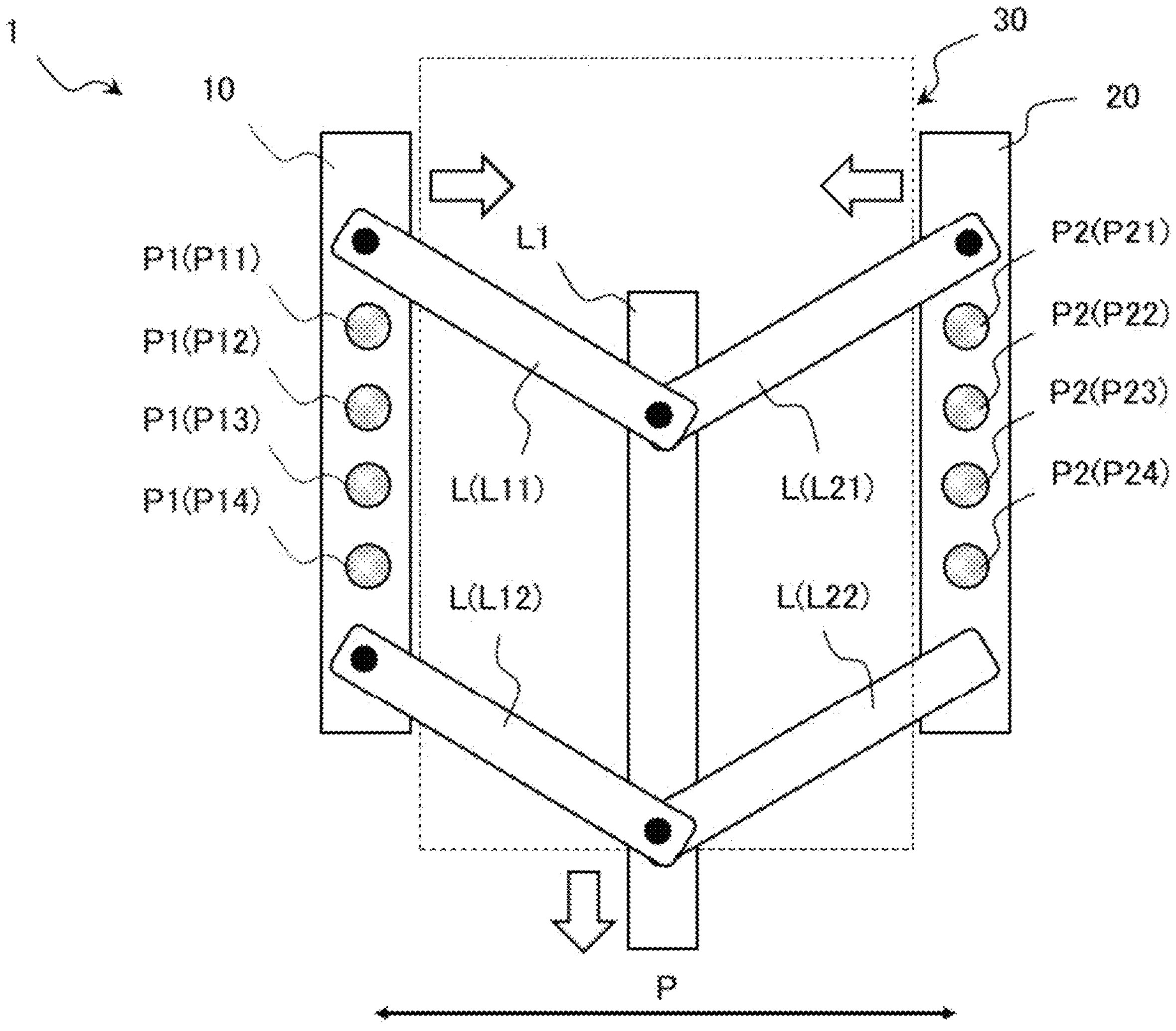
FIG. 8 is a schematic plan view of a probe unit showing a modification of the first moving mechanism.

FIGS. 7 and 8 are schematic plan views of a probe unit showing a modification of the first moving mechanism.

As shown in FIG. 7, the first moving mechanism 30 may have a link structure composed of a link L. Specifically, there is a link L1 corresponding to the support parts between the first probe holding plate 10 and the second probe holding plate 20, and one end of each of links L11 and L12 and links L21 and L22 corresponding to the frames is connected to the link L1. Further, the other end of each of the links L11 and L12 is connected to the first probe holding plate 10, and the other end of each of the links L21 and L22 is connected to the second probe holding plate 20.

By configuring the first moving mechanism 30 in such a way, as shown in FIG. 8, when the link L1 is moved in the direction in which the positive-electrode probes P1 or the negative-electrode probes P2 are arranged in order, the first probe holding plate 10 and the second probe holding plate 20 move in the direction toward each other. That is, the inter-probe pitch P becomes shorter.

On the other hand, when the link L1 is moved in the direction opposite to the arrow direction from the state shown in FIG. 8, the first probe holding plate 10 and the second probe holding plate 20 move in the direction away from each other. That is, the inter-probe pitch P becomes longer.

Thus, as long as the spirit of the present invention is not deviated, the configuration of the first moving mechanism 30 can be changed in design as appropriate.

[Second Moving Mechanism]

Figure 9:
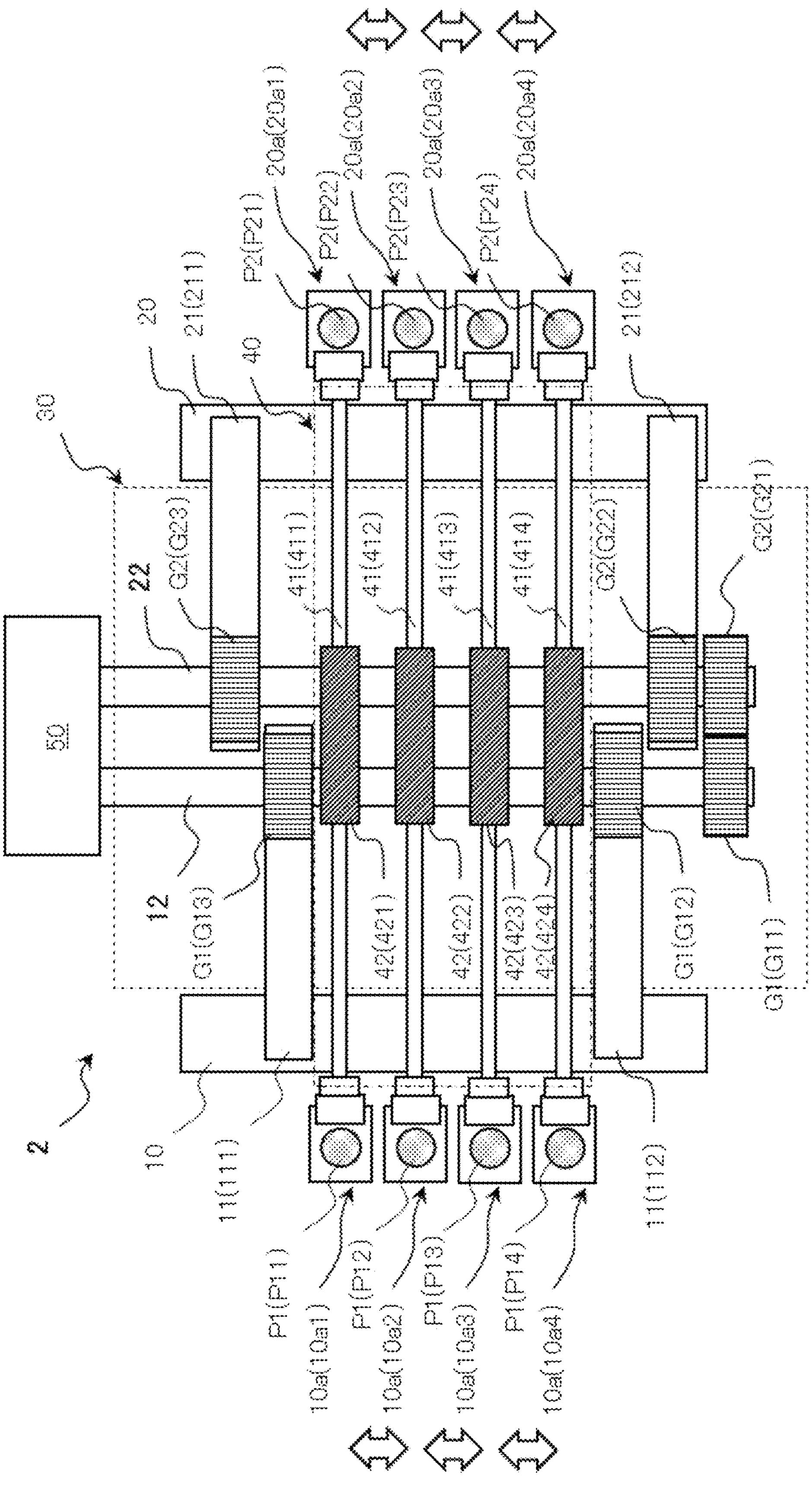
FIG. 9 is a schematic plan view of a probe unit according to another embodiment of the present invention.
Figure 10:
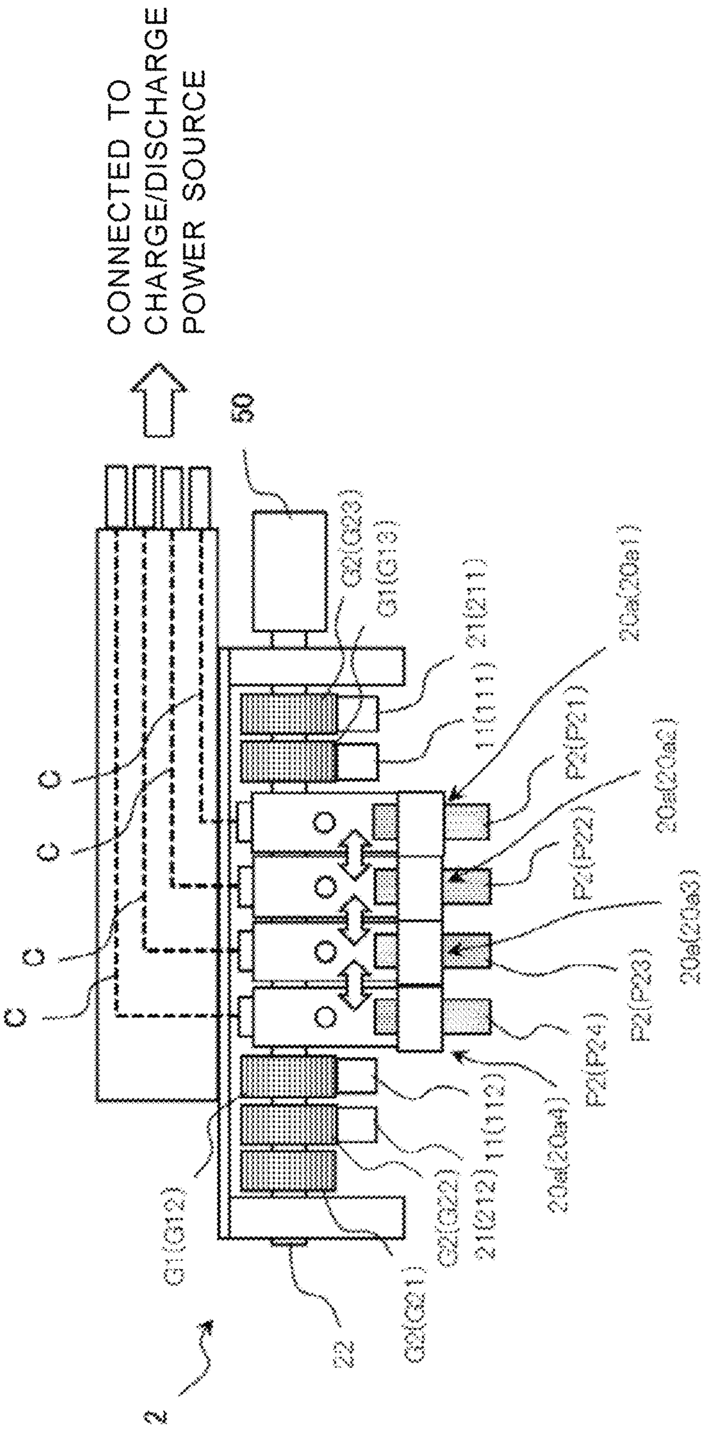
FIG. 10 is a schematic right-side view of the probe unit according to another embodiment of the present invention.

FIG. 9 is a schematic plan view of a probe unit according to another embodiment of the present invention, and FIG. 10 is a schematic right-side view of the probe unit according to another embodiment of the present invention.

A probe unit 2 according to another embodiment of the present invention further includes a second moving mechanism 40.

As shown in FIG. 9, the second moving mechanism 40 is for moving a plurality of positive-electrode probes P1 in the direction toward each other and the direction away from each other and moving a plurality of negative-electrode probes P2 in the direction toward each other and the direction away from each other.

Specifically, the probe unit 2 has a plurality of first probe holding plates 10*a* on which the plurality of positive-electrode probes P1 are arranged in order. On the plurality of first probe holding plates 10*a* (10*a*1, 10*a*2, 10*a*3, and 10*a*4), the plurality of positive-electrode probes P1 (P11, P12, P13, and P14) are respectively arranged one by one.

Note that the same applies to the relationship between the plurality of second probe holding plates 20*a* (20*a*1, 20*a*2, 20*a*3, and 20*a*4) and the plurality of negative-electrode probes P2 (P21, P22, P23, and P24).

In addition, since the plurality of first probe holding plates 10*a* (10*a*1, 10*a*2, 10*a*3, and 10*a*4) are independent of one another, for example, 10*a*1 and 10*a*2, 10*a*2 and 10*a*3, and 10*a*3 and 10*a*4 can move in the direction toward each other and the direction away from each other.

Note that the same applies to the plurality of second probe holding plates 20*a* (20*a*1, 20*a*2, 20*a*3, and 20*a*4).

Here, in this embodiment, for convenience of explanation, the configuration of the plurality of first probe holding plates 10*a* and the plurality of second probe holding plates 20*a* is separate from the configuration of the first probe holding plate 10 and the second probe holding plate 20. That is, a configuration is used in which the positive-electrode probes P1 and the negative-electrode probes P2 are arranged on the plurality of first probe holding plates 10*a* and the plurality of second probe holding plates 20*a* instead of the first probe holding plate 10 and the second probe holding plate 20, but there is no limitation to this configuration as long as the plurality of positive-electrode probes P1 arranged in order can move in the direction toward each other and the direction away from each other and the plurality of negative-electrode probes P2 arranged in order can move in the direction toward each other and the direction away from each other.

In this embodiment, the plurality of first probe holding plates 10*a* are connected to the plurality of corresponding second probe holding plates 20*a* via a plurality of frames 41 (411, 412, 413, and 414). For example, the first probe holding plate 10*a*1 is connected to the second probe holding plate 20*a*1 via the frame 411.

In addition, each of the frames 411-414 is linked to the support parts 12 and 22 via a slide part 42 (421, 422, 423, 424) provided near the center thereof. For example, the slide part 42 can move in the left-right direction in FIG. 9 by sliding on the support parts 12 and 22. Therefore, when the slide part 42 slides on the support parts 12 and 22 in the left-right direction, the first probe holding plate 10*a* and the second probe holding plate 20*a* at both ends of the frame 41 also move in the left-right direction.

By the second moving mechanism 40 making such a movement, as shown in FIG. 10, the distance between the negative-electrode probes P2 (and between the positive-electrode probes P1) can be easily changed to fit the thickness of a secondary battery attached to each of the negative-electrode probes P21, P22, P23, and P24 (and each of the positive-electrode probes P11, P12, P13, and P14).

[Power Device]

The first moving mechanism 30 and the second moving mechanism 40 described above can be moved using the power device 50 such as a servo motor or an air cylinder. For example, a servo motor can be employed as the power device 50 to rotate the support parts 12 and 22, which are rotation axes.

For example, when rack gears are used as the frames 11 and 21 of the probe unit 1, the distance by which the frames 11 and 21 move can be adjusted as desired by controlling the number of rotations of the support parts 12 and 22 using a servo motor (how many rotations are made in which direction), and therefore the distance by which the first probe holding plate 10 and the second probe holding plate 20 move, that is, the inter-probe pitch P can be adjusted as desired with accuracy.

In particular, when gears are used as the rotating parts G1 and G2, the force from the power device can be efficiently transmitted to the probe holding plates and the like, and the inter-probe pitch P can be adjusted automatically and accurately. Of course, the first moving mechanism 30 and the second moving mechanism 40 may be moved manually without using the power device.

[Guide Part and Separator Part]

On the other hand, the inter-probe pitch P can be adjusted as desired using a guide part T and a separator part S.

Figure 11:
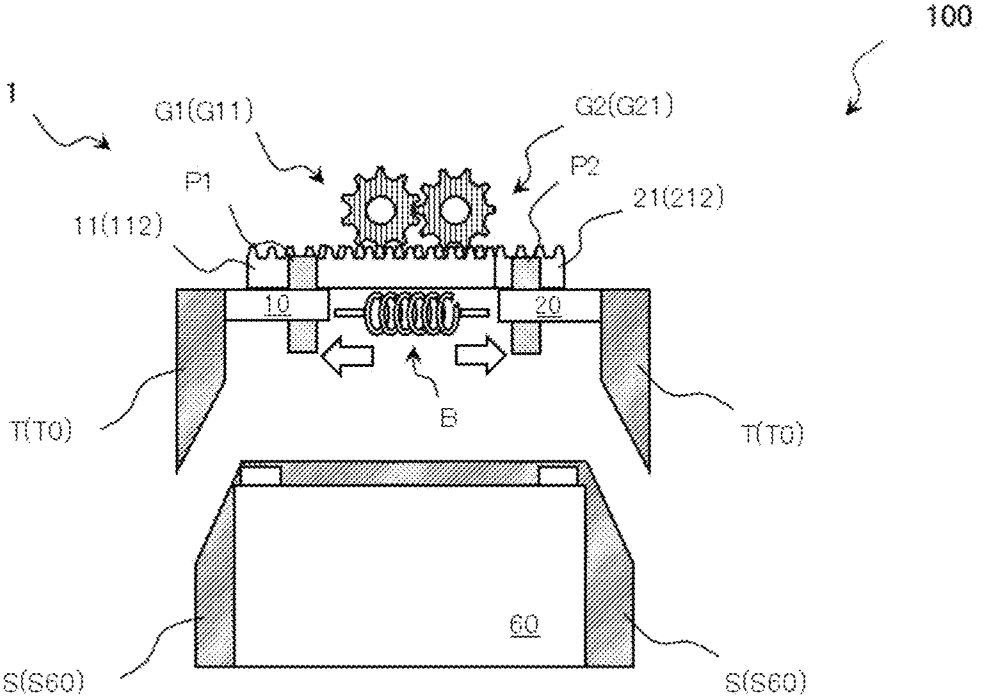
FIG. 11 is a schematic front view of a part of a charge/discharge inspection device according to an embodiment of the present invention.

FIG. 11 is a schematic front view of a part of a charge/discharge inspection device according to an embodiment of the present invention.

As shown in FIG. 11, in the charge/discharge inspection device 100, a secondary battery 60 is attached to the probe unit 1, and the secondary battery 60 to be inspected is provided with the separator part S (S60) for determining the length in the lateral width direction (the position of the lateral width) of the secondary battery 60. On the other hand, in the probe unit 1, each of the first probe holding plate 10 and the second probe holding plate 20 is provided with a tapered guide part T (T0).

Note that an elastic part B such as a spring is provided between the first probe holding plate 10 and the second probe holding plate 20 of the probe unit 1. The elastic part B is for biasing the first probe holding plate 10 and the second probe holding plate 20 in the direction toward each other.

By providing such guide parts T and such a separator part S, the guide parts T0 and the separator part S60 engage with each other when the secondary battery 60 is attached to the probe unit 1, and therefore the distance between the first probe holding plate 10 and the second probe holding plate 20 is also adjusted to fit the inter-probe pitch of the secondary battery 60.

Further, when the charge/discharge inspection is completed and the secondary battery 60 is detached from the probe unit 1, the distance between the first probe holding plate 10 and the second probe holding plate 20 is returned to the original distance (before the secondary battery 60 is attached) by the elastic part B.

By providing the configuration of the guide parts and the separator part as described above, it becomes possible to automatically guide secondary batteries into the probe unit and position the secondary batteries with respect to the probe unit, and therefore a device for moving the first moving mechanism 30 is not required.

Note that the configuration of the guide parts and the separator part may be used for the second moving mechanism 40.

Figure 12:
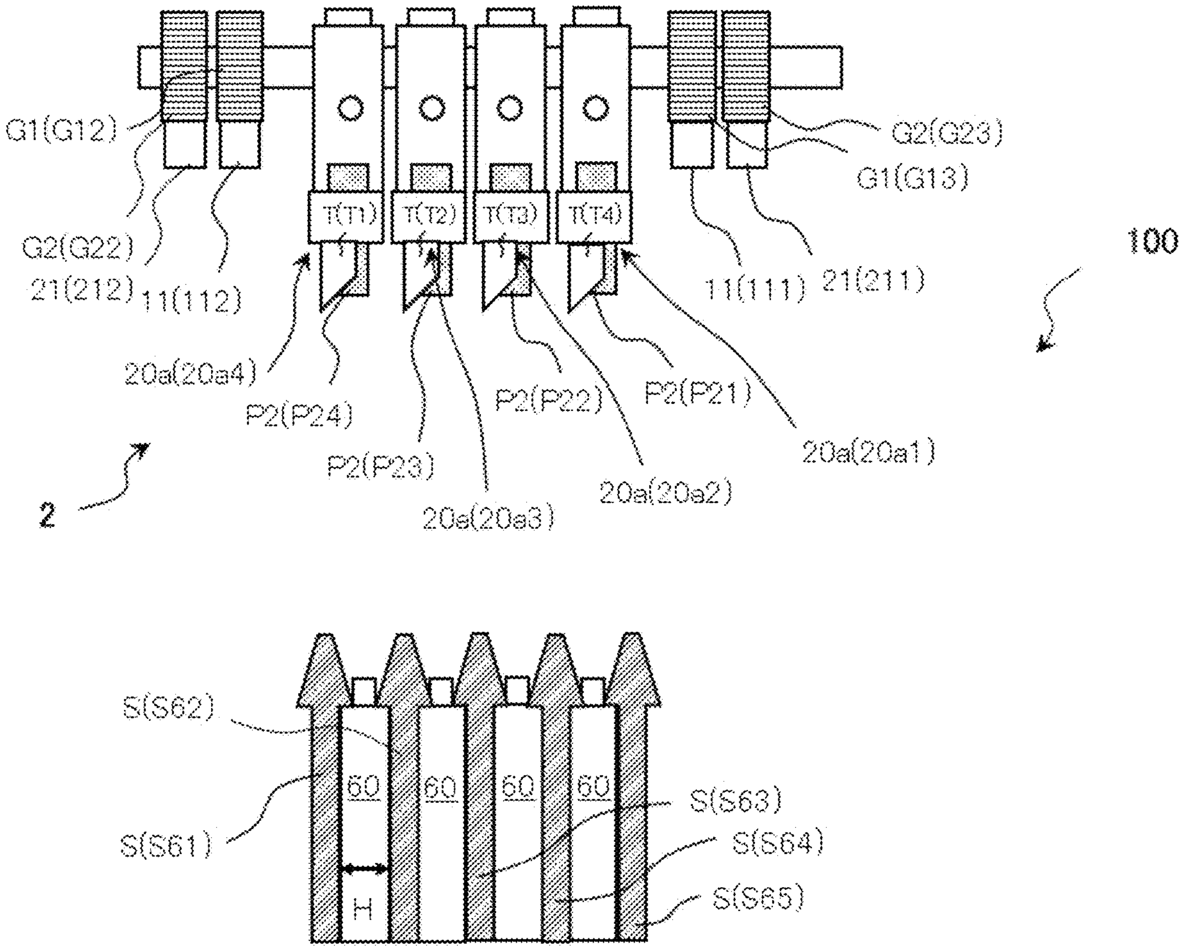
FIG. 12 is a schematic right-side view of a part of a charge/discharge inspection device according to an embodiment of the present invention.
Figure 13:
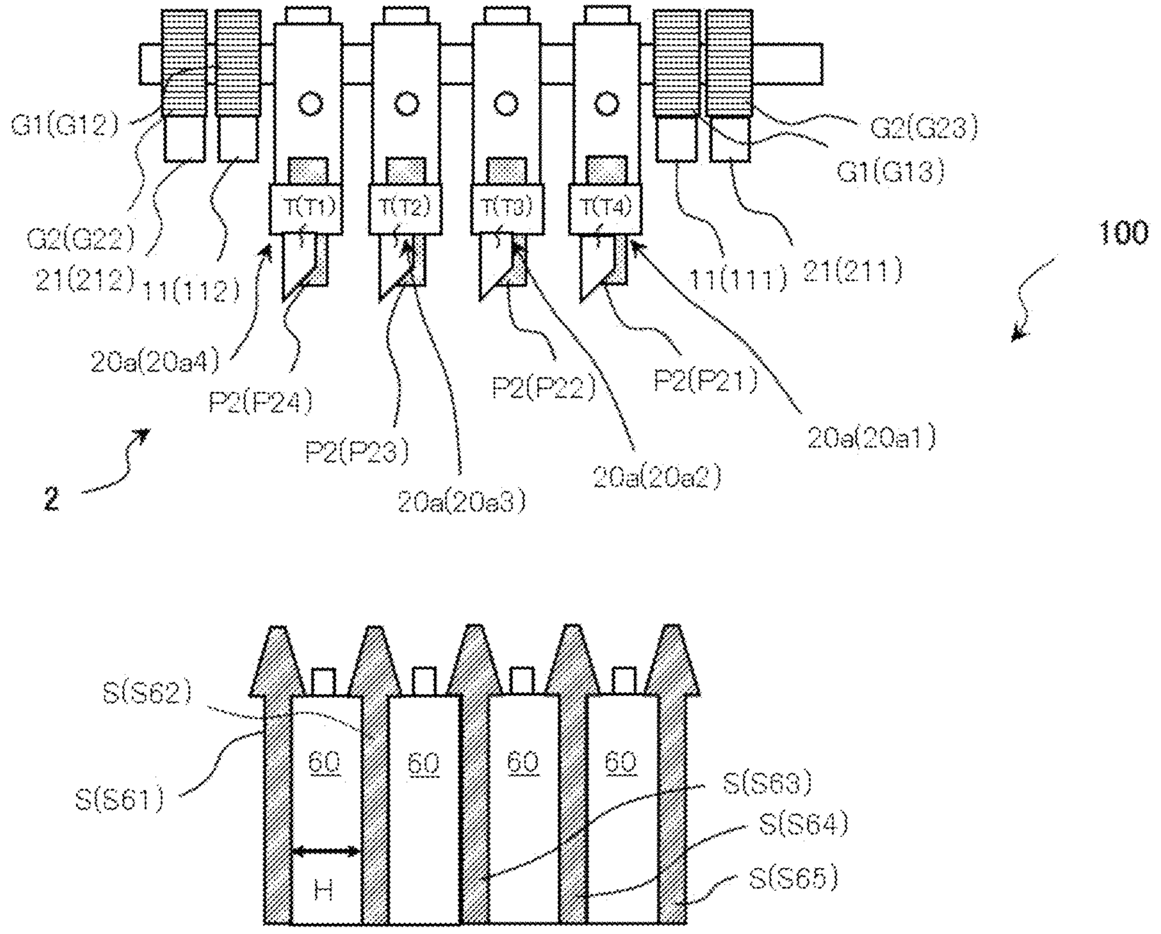
FIG. 13 is a schematic right-side view of a part of the charge/discharge inspection device according to the embodiment of the present invention.

FIGS. 12 and 13 are schematic right-side views of a part of a charge/discharge inspection device according to an embodiment of the present invention when the configurations of the guide parts and the separator part are used for the second moving mechanism.

FIG. 12 shows a case where four secondary batteries 60 to be inspected are attached to the probe unit 2, and each secondary battery 60 is provided with a separator part S (S61, S62, S63, S64, S65) for determining the length H in the thickness direction (the position of the thickness) of the secondary battery 60. Further, the probe unit 2 is also provided with a guide part T (T1, T2, T3, T4) for each of the plurality of second probe holding plates 20*a* (20*a*1, 20*a*2, 20*a*3, 20*a*4).

By providing such guide parts T and separator parts S, the separator parts S61-S65 and the guide parts T1-T4 engage with each other (to give an example, the guide part T1 engages so as to fit the groove formed between the separator part S61 and the separator part S62) when the secondary batteries 60 are attached to the probe unit 2, and therefore the distance between the second probe holding plates 20*a* is also adjusted to fit the length H in the thickness direction of the secondary battery 60. For example, like secondary batteries 60 shown in FIG. 13, even when the length H in the thickness direction is longer (thicker) than the secondary batteries 60 shown in FIG. 12, the distance between the negative-electrode probes P2 can be easily changed.

Note that although not shown, the first probe holding plates 10*a* side of the probe unit 2 has the same configuration, and the distance between the positive-electrode probes P1 can be changed. Of course, the guide parts T and the separator parts S may be provided on either one (e.g., only on the second probe holding plates 20*a* side).

By providing the configuration of the guide parts and the separator parts as described above, it becomes possible to automatically guide secondary batteries into the probe unit and position the secondary batteries with respect to the probe unit, and therefore a device for moving the second moving mechanism 40 is not required.

In addition, as a result, it is possible to realize cost reduction and ease of maintenance, and it is possible to select/realize the most efficient charge/discharge inspection method according to various inspection contents, such as cases where it is better to use the first moving mechanism 30 or the second moving mechanism 40, or cases where it is better not to use either, in terms of efficiency.

Note that the present embodiments described above are merely examples, and as long as the spirit of the present invention is not deviated, the configuration of the second moving mechanism 40 and the configuration of the guide parts T and the separator parts S can also be changed in design as appropriate.

INDUSTRIAL APPLICABILITY

The present invention is useful in industry because it can be used as a probe unit and a charge/discharge inspection device that make it possible to more efficiently inspect a plurality of types of secondary batteries.

REFERENCE SIGNS LIST

1, 2 probe unit
10, 10_a_, 10_a_1, 10_a_2, 10_a_3, 10_a_4 first probe holding plate
11, 111, 112 frame (first probe holding plate side)
12 support part (first probe holding plate side)
20, 20_a_, 20_a_1, 20_a_2, 20_a_3, 20_a_4 second probe holding plate
21, 211, 212 frame (second probe holding plate side)
22 support part (second probe holding plate side)
30 first moving mechanism
40 second moving mechanism
41, 411, 412, 413, 414 frame
42, 421, 422, 423, 424 slide part
50 power device
60 secondary battery
100 charge/discharge inspection device
P inter-probe pitch
P1, P11, P12, P13, P14 positive-electrode probe
P2, P21, P22, P23, P24 negative-electrode probe
H length in thickness direction
B elastic part
C cable
G1, G11, G12, G13 rotating part (first probe holding plate side)
G2, G21, G22, G23 rotating part (second probe holding plate side)
L1 support part (link)
L11, L12 frame (link/first probe holding plate side)
L21, L22 frame (link/second probe holding plate side)
T, T0, T1, T2, T3, T4 guide part
S, S60, S61, S62, S63, S64, S65 separator part

The invention claimed is:

1. A probe unit for a charge/discharge inspection device, the probe unit comprising:
a plurality of first probe holding plates on which one or more positive-electrode probes are arranged in order;
a plurality of second probe holding plates that are opposite to the plurality of respective first probe holding plates and on which one or more negative-electrode probes are arranged in order; and
a movable support part that is provided between the plurality of first probe holding plates and the plurality of second probe holding plates so as to extend in a direction in which the positive-electrode probes or the negative-electrode probes are arranged, wherein
the probe unit comprises:
a first moving mechanism that, in a state where the plurality of first probe holding plates or/and the plurality of second probe holding plates are attached so as to be movable in a direction toward each other and a direction away from each other, moves the plurality of first probe holding plates or/and the plurality of second probe holding plates in the direction toward each other and the direction away from each other; and
a second moving mechanism that moves the plurality of first probe holding plates in a direction toward each other and a direction away from each other and moves the plurality of second probe holding plates in a direction toward each other and a direction away from each other,
in the first moving mechanism, the support part is linked to the plurality of first probe holding plates and the support part is linked to the plurality of second probe holding plates via a frame, and by moving the support part, a connection portion between the frame and the plurality of first probe holding plates or/and a connection portion between the frame and the plurality of second probe holding plates are moved in a direction connecting the first probe holding plates and the second probe holding plates, and
in the second moving mechanism, a frame that links each of the plurality of first probe holding plates and each of the plurality of second probe holding plates corresponding to the first probe holding plate moves in a direction in which the support part extends to move the plurality of first probe holding plates and the plurality of second probe holding plates in a direction in which the plurality of positive-electrode probes or the plurality of negative-electrode probes are arranged.

2. The probe unit according to claim 1, comprising a power device that moves the first moving mechanism or/and the second moving mechanism.

* * * * *